United States Patent
Wen et al.

(10) Patent No.: US 10,917,086 B2
(45) Date of Patent: Feb. 9, 2021

(54) BACK-TO-BACK POWER SWITCH CONTROLLER

(71) Applicant: STMicroelectronics (Shenzhen) R&D Co. Ltd., Nanshan (CN)

(72) Inventors: Jian Wen, Shenzhen (CN); Hong Xia Li, Shenzhen (CN); Mei Yang, Shenzhen (CN)

(73) Assignee: STMICROELECTRONICS (SHENZHEN) R&D CO. LTD., Shenzhen (CN)

( * ) Notice: Subject to any disclaimer, the term of this patent is extended or adjusted under 35 U.S.C. 154(b) by 0 days.

(21) Appl. No.: 16/410,857

(22) Filed: May 13, 2019

(65) Prior Publication Data

US 2020/0366287 A1   Nov. 19, 2020

(51) Int. Cl.
*H03K 17/687* (2006.01)
*H03F 3/45* (2006.01)
*G01R 31/30* (2006.01)

(52) U.S. Cl.
CPC ..... *H03K 17/6871* (2013.01); *H03F 3/45273* (2013.01); *G01R 31/3008* (2013.01)

(58) Field of Classification Search
None
See application file for complete search history.

(56) References Cited

U.S. PATENT DOCUMENTS

| | | |
|---|---|---|
| 3,553,541 A | 1/1971 | King |
| 4,307,298 A | 12/1981 | El Hamamsy et al. |
| 5,003,246 A | 3/1991 | Nadd |
| 5,682,050 A | 10/1997 | Williams |
| 6,424,035 B1 | 7/2002 | Sapp et al. |
| 10,560,092 B2 * | 2/2020 | Poletto ............... H03K 17/6871 |
| 2007/0127182 A1 | 6/2007 | Chang et al. |
| 2011/0115507 A1* | 5/2011 | Heaney ................. H03K 17/18 324/705 |
| 2012/0049931 A1 | 3/2012 | Yamada |
| 2013/0009623 A1 | 1/2013 | Birk et al. |
| 2014/0009189 A1 | 1/2014 | Mauder et al. |

OTHER PUBLICATIONS

Panguloori, R., Texas Instruments, "Achieve Bidirectional Control and Protection Through Back-to-Back Connected eFuse Devices", Application Report, SLVA948—Dec. 2017, 10 pages.

* cited by examiner

*Primary Examiner* — Cassandra F Cox
(74) *Attorney, Agent, or Firm* — Slater Matsil, LLP

(57) ABSTRACT

In an embodiment, a power switch controller for driving a back-to-back power switch includes: an amplifier having a supply terminal configured to receive a supply voltage, an output configured to be coupled to a gate terminal of the back-to-back power switch, a first input configured to be coupled a source terminal of the back-to-back power switch, and a second input coupled to the output of the amplifier. The amplifier is configured to generate an output voltage at the output of the amplifier, the output voltage being an offset voltage higher than a voltage at the first input of the amplifier.

24 Claims, 5 Drawing Sheets

PRIOR ART

BACK-TO-BACK POWER SWITCH CONTROLLER

TECHNICAL FIELD

The present disclosure relates generally to an electronic system and method and, in particular embodiments, to a new back-to-back power switch controller.

BACKGROUND

Conventional relays allow the flow of analog or digital signals through the relay path on either direction when the relay is on, and blocks such signals when the relay is off. Relays are conventionally implemented with mechanical components that actuate based on an electromagnet.

A bidirectional switch, also known as an analog switch or bilateral switch, operates in a similar manner as conventional relays but without mechanical components. Conventionally, analog switches are implemented with back-to-back power metal-oxide-semiconductor field-effect transistors (MOSFETs). For example, FIG. 1 shows a schematic diagram of a conventional back-to-back power switch 102 and power switch controller 104.

During normal operation, when a voltage (e.g., 5 V) is applied to supply terminal $V_{CC}$, current sources 106 and 114 generate respective currents $I_H$ and $I_L$, which cause a current $I_R$ to flow through resistor 108. Current $I_R$ causes voltage $V_{GS}$ to increase above threshold voltage $V_{TH}$ of power MOSFETs no and 112, thereby turning on power MOSFETs no and 112. When power MOSFETs no and 112 are on, analog or digital signals may flow from terminal VA to terminal VB and from terminal VB to terminal VA.

When the voltage at supply terminal $V_{CC}$ is removed (e.g., 0 V at supply terminal $V_{CC}$), voltage $V_{GS}$ drops below threshold voltage VTH, thereby causing power MOSFETs 110 and 112 to turn off. When power MOSFETs no and 112 are off, signals cannot flow from terminal VA to terminal VB or from terminal VB to terminal VA due to the intrinsic diodes (not shown) of power MOSFETs 110 and 112, which are opposing each other in back-to-back power switch 102.

SUMMARY

In accordance with an embodiment, a power switch controller for driving a back-to-back power switch includes: an amplifier having a supply terminal configured to receive a supply voltage, an output configured to be coupled to a gate terminal of the back-to-back power switch, a first input configured to be coupled a source terminal of the back-to-back power switch, and a second input coupled to the output of the amplifier. The amplifier is configured to generate an output voltage at the output of the amplifier, the output voltage being an offset voltage higher than a voltage at the first input of the amplifier.

In accordance with an embodiment, a circuit includes: a first terminal configured to be coupled to a gate terminal of a back-to-back power switch; a second terminal configured to be coupled to a source terminal of the back-to-back power switch; a first supply terminal configured to receive a first supply voltage; a second supply terminal configured to receive a second supply voltage lower than the first supply voltage; a first transistor having a current path coupled to the second supply terminal; a current mirror coupled to the first supply terminal; a second transistor having a gate coupled to the second terminal, and a current path coupled between the current path of the first transistor and the current mirror; a third transistor having a gate coupled to the second terminal, and a current path coupled between the current path of the first transistor and the current mirror; a current generator configured to generate a reference current; and an offset generator configured to generate an offset voltage based on the reference current. The offset generator is coupled between the current path of the third transistor and the current path of the first transistor.

In accordance with an embodiment, a method for driving a back-to-back power switch includes: receiving a reference voltage; receiving a supply voltage that is higher than the reference voltage; generating a reference current based on the reference voltage; generating an offset voltage based on the reference current; and applying the offset voltage between a gate terminal of the back-to-back power switch and a source terminal of the back-to-back power switch with an amplifier that includes an output coupled to the gate terminal, and a first input coupled to the source terminal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a zero-current turn on back-to-back power switch controller for, e.g., IDDQ test applications. Embodiments of the present invention may be used in other applications, such as other applications that may benefit from zero-current turn on of back-to-back power switches, among others.

In an embodiment of the present invention, a power switch controller is capable of keeping a back-to-back power switch on with substantially zero current being sourced or sunk by the back-to-back power switch from the supply terminal of the power switch controller. The power switch controller is also capable of maintaining a stable turn on potential on the power switch, causing the on-resistance of the power switch to have a small deviation. In some embodiments, the current consumed by the power switch control can be adjusted to a very small value.

Figure 1:
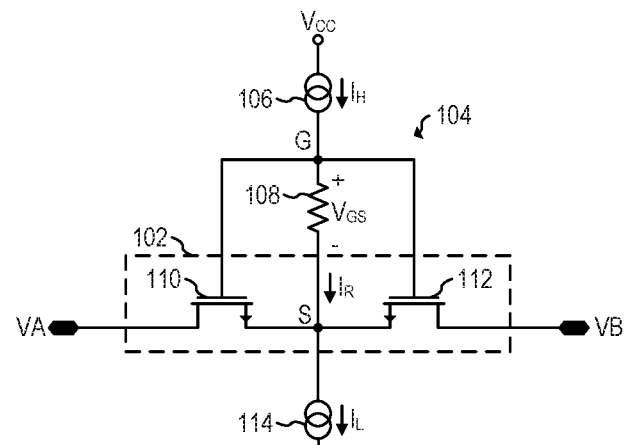
FIG. 1 shows a schematic diagram of a conventional back-to-back power switch and power switch controller.

As shown in FIG. 1, power switch controller 104 includes current sources 106 and 114, and resistor 108. When currents $I_H$ and $I_L$ produced by current sources 106 and 114, respectively, have a mismatch (e.g., when current $I_H$ is higher than current $I_L$, or when current $I_L$ is higher than current $I_H$), the extra current is sourced or sunk by back-to-back power switch 102 when back-to-back power switch 102 is on.

Some applications rely on substantially zero current sunk/sourced for turning on back-to-back power switches to operate properly. An example of such application is IDDQ testing. During IDDQ testing, an integrated circuit (IC) is tested for the presence of manufacturing defects by measuring the current consumption of the IC (e.g., current flowing through supply terminal $V_{CC}$). Some manufacturing defects manifest as higher current in an IDDQ test. During IDDQ testing, an IC may fail the test if the current flowing through supply terminal VCC is higher than a predetermined threshold (e.g., which may be a few μA or a few mA depending on the application). Having a zero-current turn on back-to-back power switch, therefore, advantageously allows, e.g., the use of a power switch during IDDQ testing without substantially affecting the current measurements during IDDQ testing, thereby increasing the effectiveness of IDDQ testing in detecting manufacturing defects.

In an embodiment of the present invention, zero current sunk or sourced by a back-to-back power switch from the power switch controller is achieved by using a one stage amplifier buffer for driving the gates of the transistors of the back-to-back power switch. The positive input of the one stage amplifier buffer is coupled to the sources of the transistors of the back-to-back power switch. An offset voltage is introduced between the negative input of the one stage amplifier buffer and the output of the one stage amplifier buffer.

Figure 2:
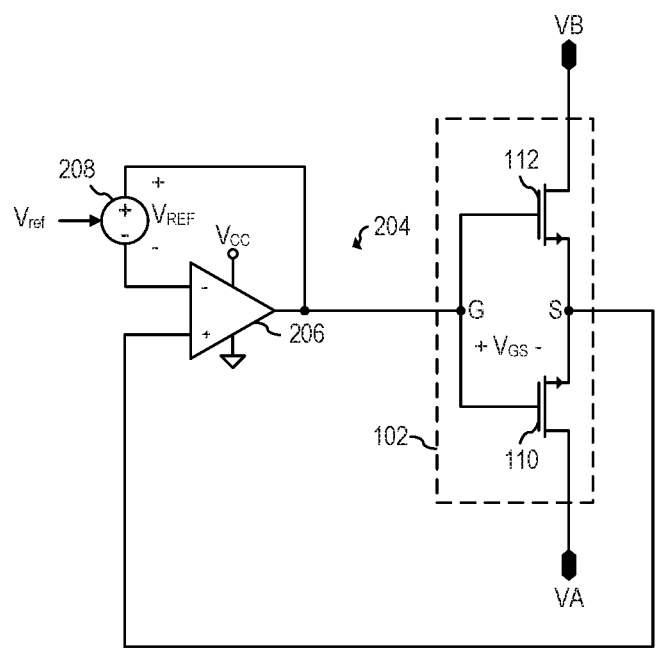
FIG. 2 shows a schematic diagram of a back-to-back power switch and a power switch controller, according to an embodiment of the present invention.

FIG. 2 shows a schematic diagram of back-to-back power switch 102 and power switch controller 204, according to an embodiment of the present invention. Power switch controller 204 includes amplifier 206 and offset generator 208.

During normal operation, offset generator generates offset voltage $V_{REF}$, and amplifier 206 operates as a buffer with an offset, where the offset is equal to offset voltage $V_{REF}$. Amplifier 206, therefore, applies at node G a voltage that is $V_{REF}$ higher than the voltage at node S, thereby maintaining a constant $V_{GS}$ voltage equal to $V_{REF}$ irrespective of the voltage of the signal flowing between terminals VA and VB.

As shown in FIG. 2, the output of amplifier 206 drives a high impedance node, since the output of amplifier 206 drives the gates of power MOSFETs no and 112. As also shown in FIG. 2, the source of power MOSFETs no and 112 is coupled to the positive input of amplifier 206, which is a high impedance input. Therefore, power switch controller 204 is advantageously capable of maintaining power switch 102 on without having currents being sunk or sourced by power switch 102 from power switch controller 204.

During normal operation, amplifier 206 receives supply voltage $V_{CC}$. Amplifier 206 turns on power switch 102 by turning on offset generator 208, and turns off power switch 102 by turning off offset generator 208. When offset generator 208 is on, offset generator 208 generates a voltage $V_{REF}$ that is sufficiently high to turn on transistors no and 112 in saturation mode, thereby minimizing the on-resistance of power MOSFETs no and 112.

In some embodiments, supply voltage $V_{CC}$ is at least voltage $V_{REF}$ higher than the maximum voltage of terminals VA and VB. For example, if power switch 102 is configured to receive at terminals VA and VB voltages from 0 V to 3 V, and if power transistors no and 112 are configured to be in saturation mode when their respective $V_{gs}$ are 3.3 V, then voltage $V_{REF}$ is 3.3 V, and supply voltage $V_{CC}$ is at least 6.3 V. It is understood that voltages of $V_{CC}$, $V_{REF}$ and maximum voltages of terminals VA and VB may vary with applications and transistor technologies (e.g., 1.8 V transistors, 3.3 V transistors, 5 V transistors, etc.). A person skilled in the art would know how to modify this voltage to suit the particular technology and application.

In some embodiments, when supply voltage $V_{CC}$ is removed (e.g., 0 V), power switch 102 is off.

Back-to-back power switch 102 may be implemented with power MOSFETs 112 and no being n-types transistors. In some embodiments, power MOSFETs no and 112 are implemented with diffused MOS (DMOS) transistors, such as vertical DMOS (VDMOS) or lateral DMOS (LDMOS), for example. Other transistor types of power transistors, such as p-type power transistors, may also be used.

As shown in FIG. 2, offset generator 208 may receive reference voltage $V_{ref}$ from an external circuit (not shown), where voltages $V_{REF}$ and $V_{ref}$ are equal. In some embodiments, such external circuit is a bandgap circuit, which produces a voltage that is substantially stable across temperature. In other embodiments, reference voltage $V_{REF}$ is derived from a bandgap circuit, such as by using a regulator, such as an LDO, that uses as a reference voltage a bandgap generated voltage.

In some embodiments, offset voltage $V_{REF}$ is different than reference voltage $V_{ref}$. For example, in some embodiments, offset voltage $V_{REF}$ is a scaled version of reference voltage $V_{ref}$.

In some embodiments, offset generator 208 may be turned off by gating reference voltage $V_{ref}$. In some embodiments, an external signal may be used to turn off offset generator 208. In other embodiments, if reference voltage $V_{ref}$ is provided by an LDO, the LDO may be turned off to turn off offset generator 208. Other implementations are also possible.

Figure 3A:
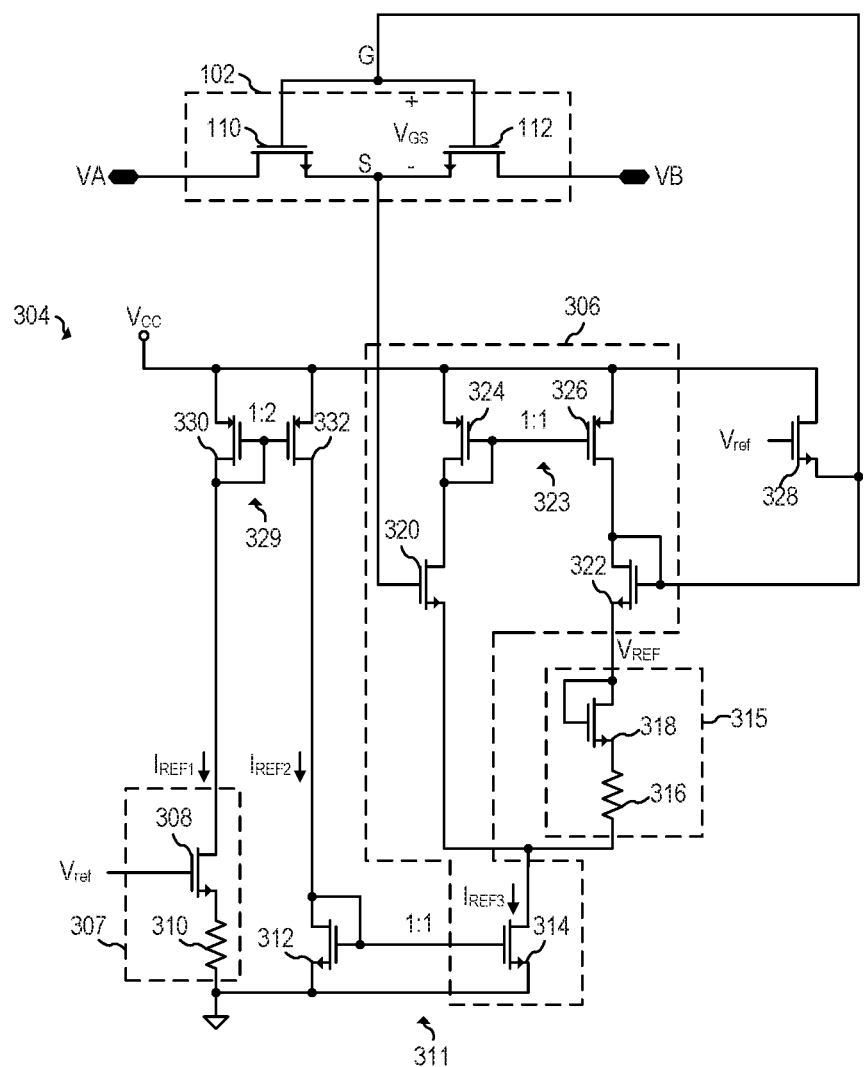
FIG. 3A shows a schematic diagram of a power switch controller, according to an embodiment of the present invention.
Figure 4:
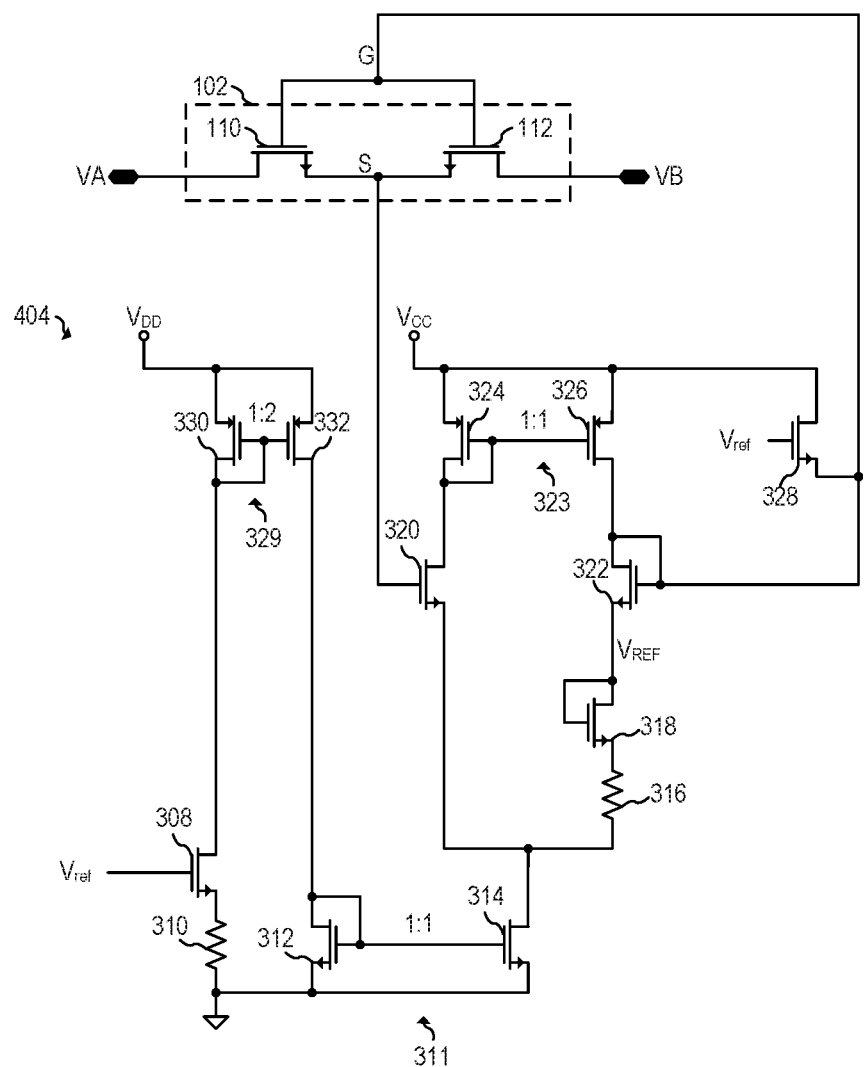
FIG. 4 shows a schematic diagram of a power switch controller, according to an embodiment of the present invention.
Figure 5:
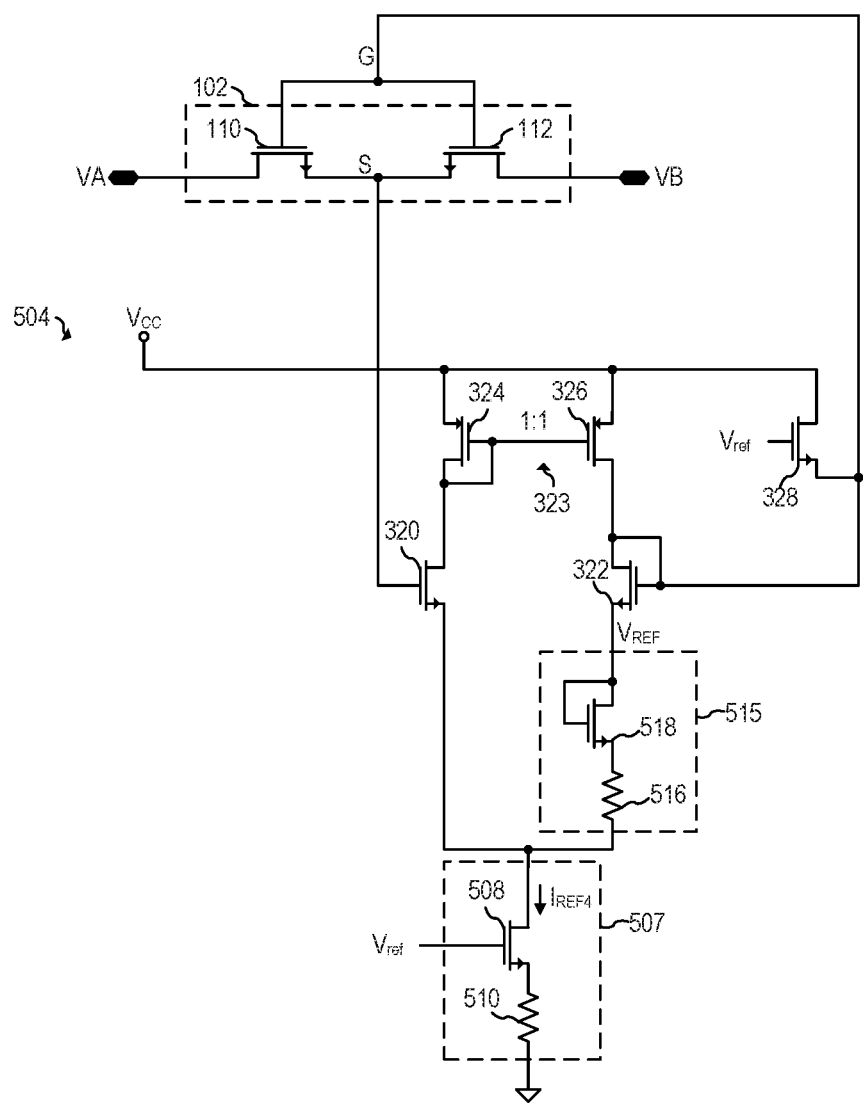
FIG. 5 shows a schematic diagram of a power switch controller, according to an embodiment of the present invention.

FIG. 3A shows a schematic diagram of power switch controller 304, according to an embodiment of the present invention. Power switch controller 304 includes one stage amplifier buffer 306. One stage amplifier buffer 306 includes transistors 314, 320, 322, 324, and 326. The gate of transistor 320 may be understood as the positive input of one stage amplifier 306, the gate of transistor 322 may understood as the negative input of one stage amplifier 306, and the drain of transistor 322 may be understood as the output of one stage amplifier 306. In the embodiments of FIGS. 3A, 4 and 5, offset voltage $V_{REF}$ is equal to reference voltage $V_{ref}$.

Power switch controller 304 also includes current generator 307 and offset generator 315. Current generator 307 and offset generator 315 are matching circuits. In other words, resistors 316 and 310 are matching and transistors 308 and 318 are matching (e.g., processes changes and temperature changes affect resistors 316 and 310 in a similar manner and transistors 318 and 308 in a similar manner). Matching circuits may be achieved, e.g., by layout placement or in any other way known in the art.

During normal operation, when supply terminal $V_{CC}$ has power (e.g., 6 V), and when reference voltage $V_{REF}$ is low (e.g., 0 V), power switch 102 is off (i.e., open). When $V_{REF}$ transitions from low (e.g., 0 V) to high (e.g., 3.3 V), transistors 328 turns fully on (i.e., in saturation mode), thereby pulling up node G to $V_{CC}$ and turning on power switch 102. When power switch 102 is on (i.e., closed), the voltage of node S is substantially similar to the voltage of terminals VA and VB (since the on-resistance of power MOSFETs no and 112 when on is very small, such as a few me). After startup, node G reaches voltage $V_{REF}$ or higher, which causes transistors 328 to turn off.

When voltage $V_{REF}$ is high (e.g., 3.3 V), transistors 308 is fully on, causing a reference current $I_{REF1}$ to flow through transistor 308. Current $I_{REF1}$ is mirrored into current $I_{REF2}$ by current mirror 329. As shown, current mirror 329 has a ratio of 2 to 1, which causes current $I_{REF2}$ to be twice of current $I_{REF1}$. Current $I_{REF2}$ is mirrored into current $I_{REF3}$ by current mirror 311. As shown, current mirror 311 has a ratio of 1 to 1, which causes current $I_{REF3}$ to be equal to current $I_{REF2}$.

Since current $I_{REF3}$ is twice of current $I_{REF1}$, if transistors 318 and 308 have the same size (e.g., similar width and length) and resistors 310 and 316 have the same resistance, one state amplifier 306 keeps node G at voltage $V_{REF}$ higher than node S, thereby keeping $V_{GS}$ constant during normal operation.

Figure 3B:
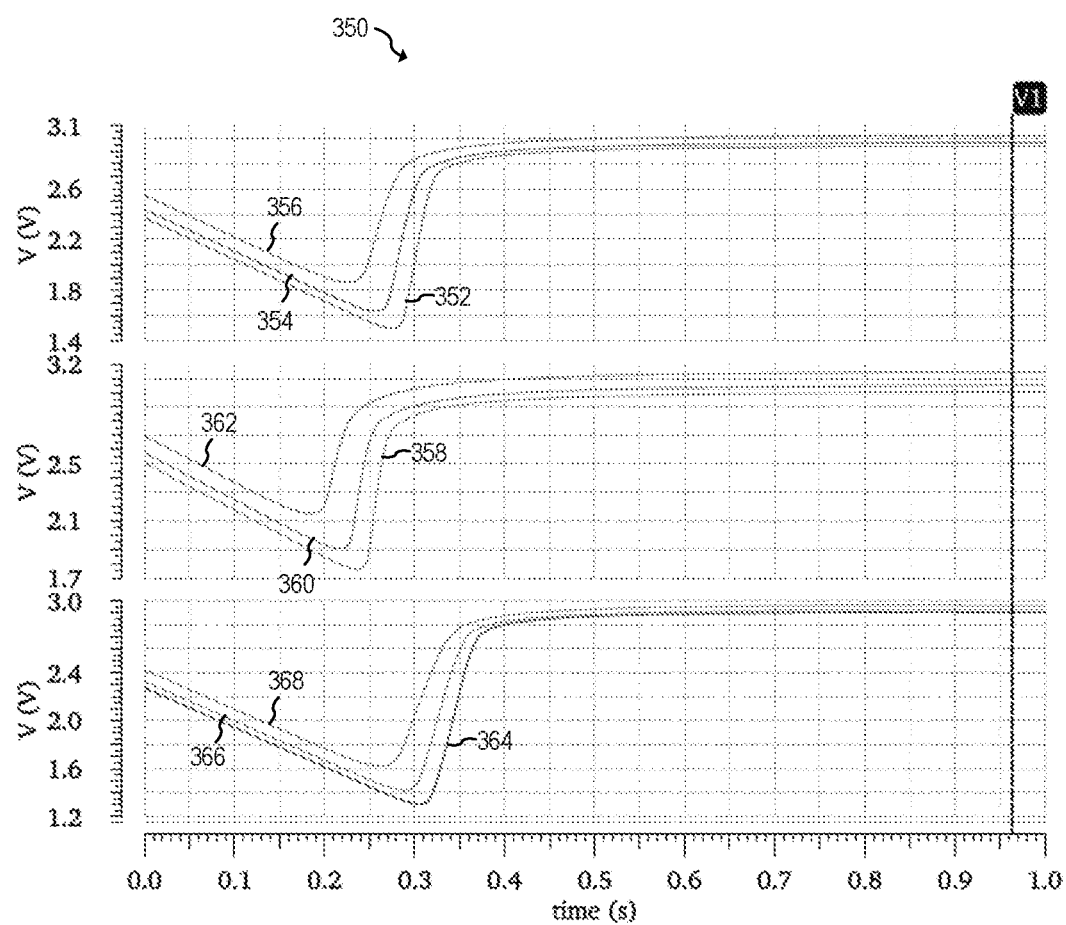
FIG. 3B shows simulation waveforms of $V_{GS}$ applied to a power switch by the power switch controller of FIG. 3A across different temperatures and process variations, according to an embodiment of the present invention.

In embodiments in which current generator 307 and offset generator 315 are matching circuits, power switch controller 304 advantageously maintains a substantially constant $V_{GS}$ across operating temperatures and process variations. For example, FIG. 3B shows simulation waveforms 350 of $V_{Gs}$ applied to power switch 102 by power switch controller 304 across different temperatures and process variations, according to an embodiment of the present invention. Curve 352 illustrates $V_{GS}$ at −40° C. at a first process corner. Curve 354 illustrates $V_{GS}$ at 25° C. at the first process corner. Curve 356 illustrates $V_{GS}$ at 150° C. at the first process corner. Curve 358 illustrates $V_{GS}$ at −40° C. at a second process corner. Curve 360 illustrates $V_{GS}$ at 25° C. at the second process corner. Curve 362 illustrates $V_{GS}$ at 150° C. at the second process corner. Curve 364 illustrates $V_{GS}$ at −40° C. at a third process corner. Curve 366 illustrates $V_{GS}$ at 25° C. at the third process corner. Curve 368 illustrates $V_{GS}$ at 150° C. at the third process corner.

As shown by curve 352, $V_{GS}$ is 2.94 V at −40° C. at the first process corner (TYP corner). As shown by curve 354, $V_{GS}$ is 2.97 V at 25° C. at the first process corner. As shown by curve 356, $V_{GS}$ is 3.02 V at 150° C. at the first process corner. As shown by curve 358, $V_{GS}$ is 3.01V at −40° C. at the second process corner (MAX corner). As shown by curve 360, $V_{GS}$ is 3.05 V at 25° C. at the second process corner. As shown by curve 362, $V_{GS}$ is 3.14 V at 150° C. at the second process corner. As shown by curve 364, $V_{GS}$ is 2.91 V at −40° C. at the third process corner (MIN corner). As shown by curve 366, $V_{GS}$ is 2.93 V at 25° C. at the third process corner. As shown by curve 368, $V_{GS}$ is 2.97 V at 150° C. at the third process corner.

FIG. 4 shows a schematic diagram of power switch controller 404, according to an embodiment of the present invention. Power switch controller 404 operates in a similar manner as power switch controller 304. Power switch controller 404, however, has a separate supply terminal $V_{DD}$ to provide power to current mirror 329.

In some embodiments, separate supply terminal $V_{DD}$ receives a voltage that is lower than supply terminal $V_{CC}$. For example, in some embodiments, supply terminal may receive a voltage of 6.3 V or higher while separate supply terminal $V_{DD}$ receives a voltage of 3 V. Using separate terminal $V_{DD}$ may advantageously allow for reducing power consumption and silicon area by allowing the use of smaller transistors (e.g., transistors 330 and 332) by providing a lower voltage to the separate supply terminal $V_{DD}$ without affecting performance.

FIG. 5 shows a schematic diagram of power switch controller 504, according to an embodiment of the present invention. Power switch controller 504 operates in a similar manner as power switch controller 304. Power switch controller 504, however, generates current $I_{REF4}$ by using current generator 507. Current generator 507 and offset generator 515 are matching circuits.

Offset generator 515 generates an offset of $V_{REF}$ by having resistor 516 with twice the resistance of resistor 510, and by having transistor 518 with twice the size (e.g., double the width and the same length) of transistors 508.

It is understood that modifications of the embodiments disclosed are also possible. For example, with respect to FIG. 2, offset generator 208 may be coupled to the positive input of amplifier 206 instead of on the negative input of amplifier 206. In some embodiments, offset generator 208 may be implemented as two or more offset generators coupled to the negative and/or positive inputs of amplifier 206. As another, non-limiting example, with respect to FIG. 3A, current mirrors 329, 311 and 323 may have different scaling ratios, which may be compensated by modifications to voltage $V_{REF}$, and resistors 310 and 316 and/or transistors sizes of one or more transistors of power switch controller 304. Other modifications are also possible.

Example embodiments of the present invention are summarized here. Other embodiments can also be understood from the entirety of the specification and the claims filed herein.

Example 1. A power switch controller for driving a back-to-back power switch that has a gate terminal, a source terminal, a first terminal, and a second terminal, the power switch controller including: an amplifier having a supply terminal configured to receive a supply voltage, an output configured to be coupled to the gate terminal of the back-to-back power switch, a first input configured to be coupled the source terminal of the back-to-back power switch, and a second input coupled to the output of the amplifier, where the amplifier is configured to generate an output voltage at the output of the amplifier, the output voltage being an offset voltage higher than a voltage at the first input of the amplifier.

Example 2. The power switch controller of example 1, where the amplifier includes: a second supply terminal configured to receive a second supply voltage lower than the supply voltage; a first transistor having a current path coupled to the second supply terminal; a current mirror coupled to the supply terminal; a second transistor having a gate coupled to the first input of the amplifier, and a current path coupled between the current path of the first transistor and the current mirror; and a third transistor having a gate coupled to the second input of the amplifier, and a current path coupled between the current path of the first transistor and the current mirror.

Example 3. The power switch controller of one of examples 1 or 2, further including a fourth transistor having a current path coupled to the supply terminal, the current path of the fourth transistor configured to be coupled to the gate terminal of the back-to-back power switch.

Example 4. The power switch controller of one of examples 1 to 3, further including: a current generator configured to generate a reference current; and an offset generator configured to generate the offset voltage based on the reference current.

Example 5. The power switch controller of one of examples 1 to 4, where the offset generator is coupled between the current path of the first transistor and the current path of the third transistor.

Example 6. The power switch controller of one of examples 1 to 5, where the offset generator and the current generator are matching circuits.

Example 7. The power switch controller of one of examples 1 to 6, where the current generator includes the first transistor and a first resistor coupled in series with the first transistor.

Example 8. The power switch controller of one of examples 1 to 7, where the current generator includes a fourth transistor and a first resistor coupled in series with the fourth transistor, where the offset generator includes a fifth transistor and a second resistor coupled in series with the fifth transistor, and where the first resistor has a first resistance that is equal to a second resistance of the second resistor.

Example 9. The power switch controller of one of examples 1 to 8, further including: a second current mirror coupled to the current generator; and a third current mirror coupled to the second current mirror, the third current mirror including the first transistor.

Example 10. The power switch controller of one of examples 1 to 9, further including a third supply terminal configured to receive a third supply voltage higher than the second supply voltage and lower than the supply voltage, where the second current mirror is coupled to the third supply terminal.

Example 11. The power switch controller of one of examples 1 to 10, where the second current mirror includes a current ratio of two to one.

Example 12. The power switch controller of one of examples 1 to 11, where the first, second, and third transistors are n-type transistors.

Example 13. The power switch controller of one of examples 1 to 12, where the power switch controller is configured to receive a reference voltage, and where the amplifier is configured to generate the offset voltage based on the reference voltage.

Example 14. The power switch controller of one of examples 1 to 13, where the supply voltage is higher than the reference voltage.

Example 15. The power switch controller of one of examples 1 to 14, where the amplifier is configured to: turn on the back-to-back power switch when the reference voltage is at a first voltage; and turn off the back-to-back power switch when the reference voltage is at a second voltage.

Example 16. The power switch controller of one of examples 1 to 15, where the first voltage is higher than the second voltage.

Example 17. The power switch controller of one of examples 1 to 16, where the reference voltage is a bandgap voltage.

Example 18. A circuit including: a first terminal configured to be coupled to a gate terminal of a back-to-back power switch; a second terminal configured to be coupled to a source terminal of the back-to-back power switch; a first supply terminal configured to receive a first supply voltage; a second supply terminal configured to receive a second supply voltage lower than the first supply voltage; a first transistor having a current path coupled to the second supply terminal; a current mirror coupled to the first supply terminal; a second transistor having a gate coupled to the second terminal, and a current path coupled between the current path of the first transistor and the current mirror; a third transistor having a gate coupled to the second terminal, and a current path coupled between the current path of the first transistor and the current mirror; a current generator configured to generate a reference current; and an offset generator configured to generate an offset voltage based on the reference current, the offset generator coupled between the current path of the third transistor and the current path of the first transistor.

Example 19. The circuit of example 18, further including the back-to-back power switch, the gate terminal of the back-to-back switch coupled to the first terminal, the source terminal coupled to the second terminal, the back-to-back switch also including a third terminal and a fourth terminal.

Example 20. The circuit of one of examples 18 or 19, where the back-to-back power switch includes: a first diffused metal oxide semiconductor (DMOS) transistor of an n-type; and a second DMOS transistor of the n-type, the first and second DMOS transistors having respective gates coupled to the gate terminal, and respective sources coupled to the source terminal, where a drain of the first DMOS transistor is coupled to the third terminal and a drain of the second DMOS transistor is coupled to the fourth terminal.

Example 21. A method driving a back-to-back power switch, the method including: receiving a reference voltage; receiving a supply voltage that is higher than the reference voltage; generating a reference current based on the reference voltage; generating an offset voltage based on the reference current; and applying the offset voltage between a gate terminal of the back-to-back power switch and a source terminal of the back-to-back power switch with an amplifier that includes an output coupled to the gate terminal, and a first input coupled to the source terminal.

Example 22. The method of example 21, further including: turning on the back-to-back power switch by increasing the offset voltage to a first voltage; and turning off the back-to-back power switch by decreasing the offset voltage to a second voltage.

Example 23. The method of one of examples 21 or 22, where the first voltage is higher than the second voltage, and where the second voltage is 0 V.

Example 24. The method of one of examples 21 to 23, further including: receiving the supply voltage at a supply terminal; increasing the reference voltage from a first voltage to a second voltage; turning on a first transistor with the reference voltage when the reference voltage is at the second voltage, the first transistor having a current path coupled between the supply terminal and the gate terminal; and increasing the offset voltage based on the increase of the reference voltage; and turning off the first transistor when the offset voltage reaches the second voltage.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A power switch controller for driving a back-to-back power switch that has a gate terminal, a source terminal, a first terminal, and a second terminal, the power switch controller comprising:
    an amplifier having a supply terminal configured to receive a supply voltage, an output configured to be coupled to the gate terminal of the back-to-back power switch, a first input configured to be coupled the source terminal of the back-to-back power switch, and a second input coupled to the output of the amplifier, wherein the amplifier is configured to generate an output voltage at the output of the amplifier, the output voltage being an offset voltage higher than a voltage at the first input of the amplifier.

2. The power switch controller of claim 1, wherein the amplifier comprises:
    a second supply terminal configured to receive a second supply voltage lower than the supply voltage;
    a first transistor having a current path coupled to the second supply terminal;
    a current mirror coupled to the supply terminal;
    a second transistor having a gate coupled to the first input of the amplifier, and a current path coupled between the current path of the first transistor and the current mirror; and
    a third transistor having a gate coupled to the second input of the amplifier, and a current path coupled between the current path of the first transistor and the current mirror.

3. The power switch controller of claim 2, further comprising a fourth transistor having a current path coupled to the supply terminal, the current path of the fourth transistor configured to be coupled to the gate terminal of the back-to-back power switch.

4. The power switch controller of claim 2, further comprising:
    a current generator configured to generate a reference current; and
    an offset generator configured to generate the offset voltage based on the reference current.

5. The power switch controller of claim 4, wherein the offset generator is coupled between the current path of the first transistor and the current path of the third transistor.

6. The power switch controller of claim 4, wherein the offset generator and the current generator are matching circuits.

7. The power switch controller of claim 4, wherein the current generator comprises the first transistor and a first resistor coupled in series with the first transistor.

8. The power switch controller of claim 4, wherein the current generator comprises a fourth transistor and a first resistor coupled in series with the fourth transistor, wherein the offset generator comprises a fifth transistor and a second resistor coupled in series with the fifth transistor, and wherein the first resistor has a first resistance that is equal to a second resistance of the second resistor.

9. The power switch controller of claim 4, further comprising:
    a second current mirror coupled to the current generator; and
    a third current mirror coupled to the second current mirror, the third current mirror comprising the first transistor.

10. The power switch controller of claim 9, further comprising a third supply terminal configured to receive a third supply voltage higher than the second supply voltage and lower than the supply voltage, wherein the second current mirror is coupled to the third supply terminal.

11. The power switch controller of claim 9, wherein the second current mirror comprises a current ratio of two to one.

12. The power switch controller of claim 2, wherein the first, second, and third transistors are n-type transistors.

13. The power switch controller of claim 1, wherein the power switch controller is configured to receive a reference voltage, and wherein the amplifier is configured to generate the offset voltage based on the reference voltage.

14. The power switch controller of claim 13, wherein the supply voltage is higher than the reference voltage.

15. The power switch controller of claim 14, wherein the amplifier is configured to:
    turn on the back-to-back power switch when the reference voltage is at a first voltage; and
    turn off the back-to-back power switch when the reference voltage is at a second voltage.

16. The power switch controller of claim 15, wherein the first voltage is higher than the second voltage.

17. The power switch controller of claim 13, wherein the reference voltage is a bandgap voltage.

18. A circuit comprising:
    a first terminal configured to be coupled to a gate terminal of a back-to-back power switch;
    a second terminal configured to be coupled to a source terminal of the back-to-back power switch;
    a first supply terminal configured to receive a first supply voltage;
    a second supply terminal configured to receive a second supply voltage lower than the first supply voltage;
    a first transistor having a current path coupled to the second supply terminal;
    a current mirror coupled to the first supply terminal;
    a second transistor having a gate coupled to the second terminal, and a current path coupled between the current path of the first transistor and the current mirror;
    a third transistor having a gate coupled to the first terminal, and a current path coupled between the current path of the first transistor and the current mirror;
    a current generator configured to generate a reference current; and
    an offset generator configured to generate an offset voltage based on the reference current, the offset generator coupled between the current path of the third transistor and the current path of the first transistor.

19. The circuit of claim 18, further comprising the back-to-back power switch, the gate terminal of the back-to-back power switch coupled to the first terminal, the source terminal coupled to the second terminal, the back-to-back power switch also including a third terminal and a fourth terminal.

20. The circuit of claim 19, wherein the back-to-back power switch comprises:
    a first diffused metal oxide semiconductor (DMOS) transistor of an n-type; and a second DMOS transistor of the n-type, the first and second DMOS transistors having respective gates coupled to the gate terminal, and respective sources coupled to the source terminal, wherein a drain of the first DMOS transistor is coupled to the third terminal and a drain of the second DMOS transistor is coupled to the fourth terminal.

21. A method for driving a back-to-back power switch, the method comprising:
  receiving a reference voltage;
  receiving a supply voltage that is higher than the reference voltage;
  generating a reference current based on the reference voltage;
  generating an offset voltage based on the reference current; and
  applying the offset voltage between a gate terminal of the back-to-back power switch and a source terminal of the back-to-back power switch with an amplifier that comprises an output coupled to the gate terminal, and a first input coupled to the source terminal.

22. The method of claim 21, further comprising:
  turning on the back-to-back power switch by increasing the offset voltage to a first voltage; and
  turning off the back-to-back power switch by decreasing the offset voltage to a second voltage.

23. The method of claim 22, wherein the first voltage is higher than the second voltage, and wherein the second voltage is 0 V.

24. The method of claim 21, further comprising:
  receiving the supply voltage at a supply terminal;
  increasing the reference voltage from a first voltage to a second voltage;
  turning on a first transistor with the reference voltage when the reference voltage is at the second voltage, the first transistor having a current path coupled between the supply terminal and the gate terminal; and
  increasing the offset voltage based on the increase of the reference voltage; and
  turning off the first transistor when the offset voltage reaches the second voltage.

* * * * *